US012628711B2

(12) United States Patent
Na et al.

(10) Patent No.: US 12,628,711 B2
(45) Date of Patent: May 12, 2026

(54) INTEGRATED CIRCUIT PACKAGE, ELECTRONIC DEVICE INCLUDING THE SAME, AND MANUFACTURING METHOD THEREOF

(71) Applicant: SAMSUNG ELECTRONICS CO., LTD., Suwon-si (KR)

(72) Inventors: Taeyang Na, Suwon-si (KR); Kicheol Bae, Suwon-si (KR); Chulwoo Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 594 days.

(21) Appl. No.: 18/070,825

(22) Filed: Nov. 29, 2022

(65) Prior Publication Data

US 2023/0085764 A1     Mar. 23, 2023

Related U.S. Application Data

(63) Continuation of application No. PCT/KR2022/004870, filed on Apr. 5, 2022.

(30) Foreign Application Priority Data

Apr. 9, 2021    (KR) ........................ 10-2021-0046585

(51) Int. Cl.
*H01L 23/498*        (2006.01)
*H01L 21/48*         (2006.01)
(Continued)

(52) U.S. Cl.
CPC .... *H01L 23/49816* (2013.01); *H01L 21/4853* (2013.01); *H01L 21/565* (2013.01);
(Continued)

(58) Field of Classification Search
CPC ........... H01L 23/49816; H01L 21/4853; H01L 21/565; H01L 23/3128; H01L 23/49833;
(Continued)

(56) References Cited

U.S. PATENT DOCUMENTS 6,294,406 B1    9/2001  Bertin et al.
6,376,917 B1    4/2002  Takeshita et al.
(Continued)

FOREIGN PATENT DOCUMENTS

KR    10-2016-0012589    2/2016
KR        10-1939011    1/2019
(Continued)

OTHER PUBLICATIONS

Korean Office Action issued Apr. 25, 2025 in corresponding Korean Patent Application No. 10-2021-0046585.
(Continued)

*Primary Examiner* — Evan G Clinton
(74) *Attorney, Agent, or Firm* — Nixon & Vanderhye P.C.

(57) ABSTRACT

Various embodiments of the disclosure relate to an integrated circuit package, an electronic device including same, and a manufacturing method therefor, the method comprising: attaching at least one first element to a first surface of a substrate; molding the first surface using a first mold; grinding the first mold; attaching at least one second element and at least one connection member comprising a conductive material to a second surface of the substrate; and attaching an interposer substrate including landing pads for an electrical connection with a printed circuit board included in an electronic device to the second surface of the substrate.

14 Claims, 10 Drawing Sheets

(51) Int. Cl.
H01L 21/56 (2006.01)
H01L 23/31 (2006.01)
H01L 25/16 (2023.01)

(52) U.S. Cl.
CPC .... H01L 23/3128 (2013.01); H01L 23/49833 (2013.01); H01L 23/49844 (2013.01); H01L 25/162 (2013.01); H01L 25/165 (2013.01)

(58) Field of Classification Search
CPC ............. H01L 23/49844; H01L 25/162; H01L 25/165; H01L 23/5383; H01L 23/552; H01L 23/5385; H01L 23/528; H01L 23/3157; H01L 23/4922; H01L 24/06; H01L 24/09; H01L 24/14; H01L 24/17; H01L 2224/09; H05K 1/181; H05K 2201/10378
See application file for complete search history.

(56) References Cited

U.S. PATENT DOCUMENTS

| | | | |
|---|---|---|---|
| 8,415,789 | B2 | 4/2013 | Ishihara |
| 8,421,222 | B2 | 4/2013 | Lin et al. |
| 9,478,481 | B2 | 10/2016 | Mitsuhashi |
| 10,134,711 | B2 | 11/2018 | Lin et al. |
| 11,239,173 | B2 | 2/2022 | Tsai et al. |

| | | | | |
|---|---|---|---|---|
| 2015/0014852 | A1 | | 1/2015 | Liu et al. |
| 2016/0027764 | A1 | | 1/2016 | Kim et al. |
| 2016/0260684 | A1 | | 9/2016 | Zhai et al. |
| 2017/0063079 | A1 | | 3/2017 | Gu et al. |
| 2019/0104653 | A1 | | 4/2019 | Jandzinski et al. |
| 2020/0075561 | A1 | | 3/2020 | Kim et al. |
| 2020/0312733 | A1 | | 10/2020 | Yeh et al. |
| 2020/0312826 | A1 | | 10/2020 | Jung et al. |
| 2021/0005542 | A1 | | 1/2021 | Mallik et al. |
| 2021/0043571 | A1 | | 2/2021 | Hou et al. |
| 2021/0225727 | A1 | * | 7/2021 | Chen ..................... H01L 24/73 |

FOREIGN PATENT DOCUMENTS

| | | |
|---|---|---|
| KR | 10-2020-0026344 A | 3/2020 |
| KR | 10-2020-0115796 A1 | 10/2020 |
| KR | 10-2021-0004830 A | 1/2021 |
| KR | 10-2021-0018775 | 2/2021 |
| WO | 2017/035510 | 3/2017 |

OTHER PUBLICATIONS

International Search Report for PCT/KR2022/004870 dated Aug. 1, 2022, 6 pages.
Written Opinion of the ISA for PCT/KR2022/004870 dated Aug. 1, 2022, 4 pages.
Korean Office Action dated Nov. 17, 2025 for KR Application No. 10-2021-0046585.

* cited by examiner

INTEGRATED CIRCUIT PACKAGE, ELECTRONIC DEVICE INCLUDING THE SAME, AND MANUFACTURING METHOD THEREOF

CROSS-REFERENCE TO RELATED APPLICATIONS

This application is a continuation of International Application No. PCT/KR2022/004870 designating the United States, filed on Apr. 5, 2022, in the Korean Intellectual Property Receiving Office and claiming priority to Korean Patent Application No. 10-2021-0046585, filed on Apr. 9, 2021, in the Korean Intellectual Property Office, the disclosures of which are incorporated by reference herein in their entireties.

BACKGROUND

Field

The disclosure relates to an integrated circuit package, an electronic device including the same, and a method for manufacturing the same.

Description of Related Art

An electronic device (for example, mobile terminal, smartphone, tablet personal computer, or wearable terminal) may provide various functions. For example, the electronic device may provide an image capture function, a music playback function, a navigation function, a telephone call function, a short-range wireless communication (for example, Bluetooth, Wi-Fi, or near field communication (NFC)) function, an electronic payment function, and/or a speech recognition function.

The electronic device may include various integrated circuits (ICs) to provide various functions described above. ICs included in the electronic device may be packaged in various manners (for example, ball grid array (BGA), land grid array (LGA)).

ICs included in recent electronic devices need to be light, thin, and compact and thus are packaged using a double side mold (DSM) ball grid array (GBA) scheme.

In general, processes of the DSM BGA package may include mounting components (for example, ICs, semiconductors) on the first surface (upper surface) of a substrate, molding the first surface to protect the components mounted on the first surface, mounting components and a soldering ball on the second surface (lower surface) of the substrate, molding the second surface, grinding the molding of the second surface, marking product information, exposing the soldering ball to the outside through laser ablation of the molding on the periphery of the soldering ball, performing reballing, performing package sawing, and performing electromagnetic interference (EMI) shielding.

However, the DSM BGA package may have a deviation occurring because the molding on the periphery of the soldering ball is not constantly ablated due to deviations of the laser and/or processing errors. If the DSM BGA package is reballed in a state in which the molding is abnormally ablated, the solder ball may be formed in an abnormal shape. If the DSM BGA package is mounted on a PCB in a state in which the solder ball is formed in an abnormal shape, a mounting defect (for example, short defect and/or non-wet (wettability defect)) may occur.

Furthermore, when the molding of the lower surface of the DSM BGA package is ground, the components mounted on the lower surface may be exposed to the outside. As a result, a defect (for example, crack) may occur if the components mounted on the lower surface of the substrate receive an external impact.

Meanwhile, when an IC having the same function is manufactured by multiple companies, components mounted on the substrate may be arranged differently by respective companies, even in the case of an IC having the same function. In addition, a different component having the same function may be packaged. In this case, respective companies may differently form the ball map of the DSM BGA package. This is because, for example, design of the PCB on which the DSM BGA package is mounted needs to vary in response to the ball map of each DSM BGA package. When an electronic device is manufactured using ICs from multiple companies due to a problem related to part supply or the like, the electronic device manufacturer needs to respectively design and fabricate PCBs included in the electronic device in response to ICs designed by respective companies.

SUMMARY

Embodiments of the disclosure may provide an integrated circuit package, an electronic device including the same, and a method for manufacturing the same, wherein an interposer substrate may be used to reduce the defect ratio, a pin map (or ball map) may be used in a shared manner, and the packaging size may be reduced.

An electronic device according to various example embodiments of the disclosure may include: a printed circuit board; and an integrated circuit package attached to the printed circuit board, wherein the integrated circuit board includes: a substrate on which a plurality of elements are attached to a first surface and a second surface opposite to the first surface; a first mold covering the first surface of the substrate; an interposer substrate attached to the second surface of the substrate and including landing pads for an electrical connection with the printed circuit board; and a connection member comprising a conductive material configured to electrically connect the substrate and the interposer substrate.

An integrated circuit package according to various example embodiments of the disclosure may include: a substrate on which a plurality of elements are attached to a first surface and a second surface opposite to the first surface; a first mold covering the first surface of the substrate; an interposer substrate attached to the second surface of the substrate and including landing pads for an electrical connection with a printed circuit board included in an electronic device; and a connection member comprising a conductive material configured to electrically connect the substrate and the interposer substrate.

A method for manufacturing an integrated circuit package according to various example embodiments of the disclosure may include attaching at least one first element to a first surface of a substrate; molding the first surface using a first mold grinding the first mold; attaching at least one second element and at least one connection member comprising a conductive material to a second surface of the substrate; and attaching an interposer substrate including landing pads for an electrical connection with a printed circuit board included in an electronic device to the second surface of the substrate.

According to various example embodiments of the disclosure, an interposer substrate including a landing pad may be used to package the lower surface of a substrate, thereby resolving a solder ball defect and/or an IC package mounting defect, resulting from deviations of laser ablation of a DSM BGA packaging process.

According to various example embodiments of the disclosure, an interposer substrate may be used to use a pin map (or ball map) of an IC in a shared manner, even if the arrangement and/or size of components mounted on the lower surface of a substrate differ.

According to various example embodiments of the disclosure, an interposer substrate may be mounted on the lower surface of a substrate such that components mounted on the lower surface are not exposed to the outside, thereby protecting internal components (for example, preventing and/or reducing damage), and reinforcing the strength of the IC package.

According to various example embodiments of the disclosure, an interposer substrate may be used to optimize a pin map (or ball map), thereby reducing the size of an IC package.

According to various example embodiments of the disclosure, the lower surface molding process may be removed, thereby reducing the time and/or cost for manufacturing (or packaging) an IC.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
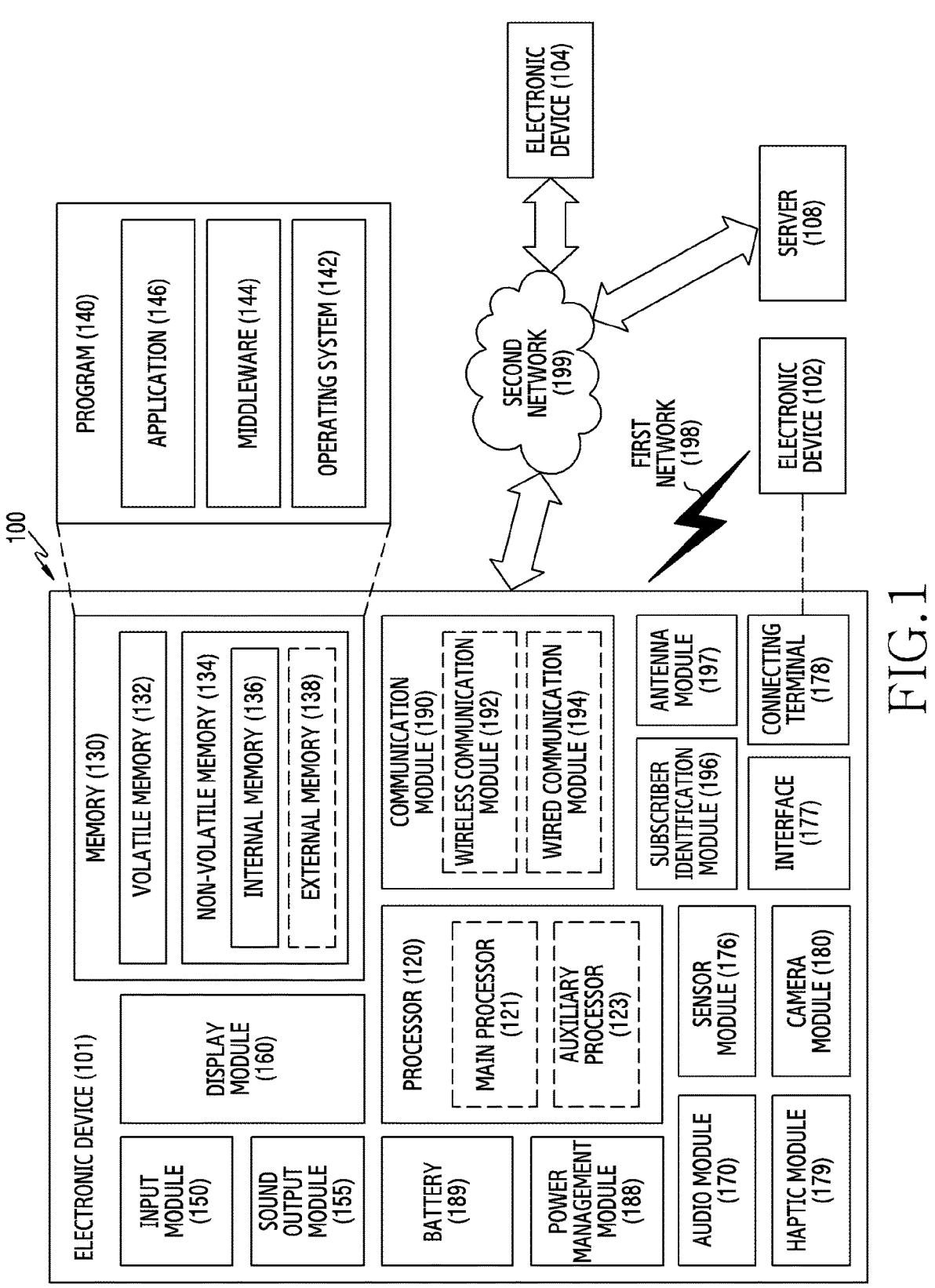
FIG. 1 is a block diagram illustrating an example electronic device in a network environment according to various embodiments.

Hereinafter, various example embodiments of the disclosure will be described with reference to the accompanying drawings. In the disclosure, various example embodiments are illustrated in the drawings and a related detailed description is mentioned, but this is not intended to limit the various example embodiments of the disclosure to a specified form.

For example, it may be apparent to one skilled in the art to which the disclosure pertains that the disclosure may be variously modified.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

According to various embodiments, at least a part (e.g., a processor 120, a memory 130, a communication module 190, a power management module 188, and an audio module 170) of various elements included in an electronic device 101 may be an integrated circuit (IC). The integrated circuit may be packaged in various ways (e.g., a ball grid array (BGA) and a land grid array (LGA)). Various embodiments of the disclosure may provide new structure and method (manufacturing process) of packaging an integrated circuit. Hereinafter, packaging structure and method for an integrated circuit according to various embodiments of the disclosure will be described.

Figure 2A:
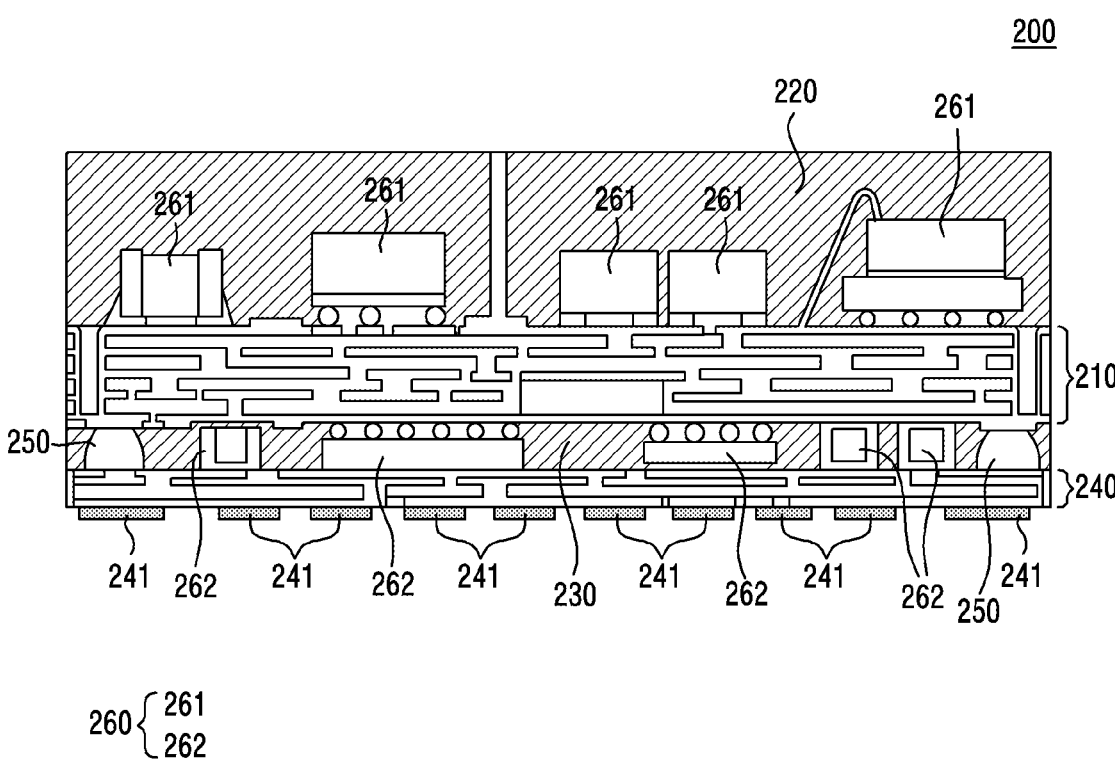
FIG. 2A is a cross-sectional view of an integrated circuit package according to various embodiments.
Figure 2B:
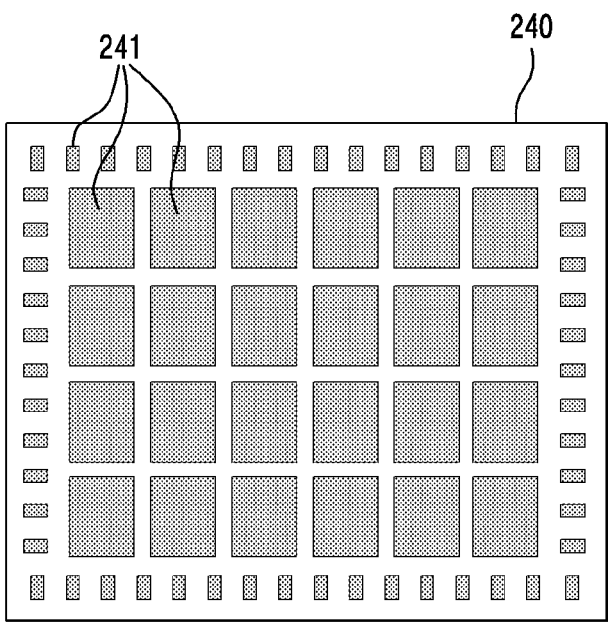
FIG. 2B is a diagram illustrating an example of a pin map of a lower surface of an integrated circuit package according to various embodiments.

FIG. 2A is a cross-sectional view of an example integrated circuit package according to various embodiments, and FIG. 2B is a diagram illustrating an example of a pin map of a lower surface of an integrated circuit package according to various embodiments.

Referring to FIG. 2A and FIG. 2B, an integrated circuit package 200 according to an embodiment of the disclosure may include a substrate 210, a first molding member (e.g., mold) 220, a second molding member (e.g., mold) 230, an interposer printed circuit board (PCB) 240, a connection member (e.g., including a conductive material) 250, and a plurality of elements (or components) 260.

According to various embodiments, the integrated circuit package 200 may be provided by packaging an integrated circuit (e.g., a semiconductor chip) to be attached (adhered, bonded, coupled, or stacked) (e.g., surface mount) to a printed circuit board (not illustrated) included in an electronic device (e.g., an electronic device 101). For example, a plurality of first elements (e.g., a transistor, a diode, a capacitor, a resistor, and the like) 261 may be attached to a first surface (an upper surface) of the substrate 210, and at least a part of the first surface of the substrate 210 may be molded by the first molding member 220 (e.g., ceramic, metal, and plastic (e.g., epoxy molding compound (EMC) mold) to protect the plurality of first elements 261. According to an embodiment, an electromagnetic shielding material may be added to the first molding member 220, and an electromagnetic shielding material may be coated on or attached to a surface of the first molding member 220 so as to provide an electromagnetic shielding structure. A plurality of second elements 262 and the connection member 250 may be attached to a second surface (a lower surface) of the substrate 210, and at least a part of the second surface of the substrate 210 may be molded by the second molding member 230. After the second surface of the substrate 210 is molded, the second molding member 230 may be ground to allow the connection member 250 to be exposed to the outside. According to an embodiment, due to the grinding, an outer surface of at least a part of the second elements 262 may be exposed to the outside.

After grinding the second molding member 230, the interposer PCB 240 may be attached to a second surface of the substrate 210. The interposer PCB 240 may be attached to the substrate 210 via the connection member 250. At least a part of the connection member 250 may electrically connect the substrate 210 and the interposer PCB 240. The interposer PCB 240 may include landing pads 241 for an electrical connection with a printed circuit board (not illustrated). As illustrated in FIG. 2B, the landing pads 241 may be arranged on a second surface (a lower surface) which is opposite to a first surface (a surface facing the second surface of the substrate 210) (an upper surface) of the interposer PCB 240 in multiple columns and rows. The arrangement (pin map) of the landing pads 241 illustrated in FIG. 2B is merely an example and does not limit the embodiment of the disclosure.

According to various embodiments, the connection member 250 may electrically connect the interposer PCB 240 and the substrate 210 and may include, for example, and without limitation, an interposer ball, a soldering ball, a cu-cored ball, a cu-post, or the like.

Figure 3A:
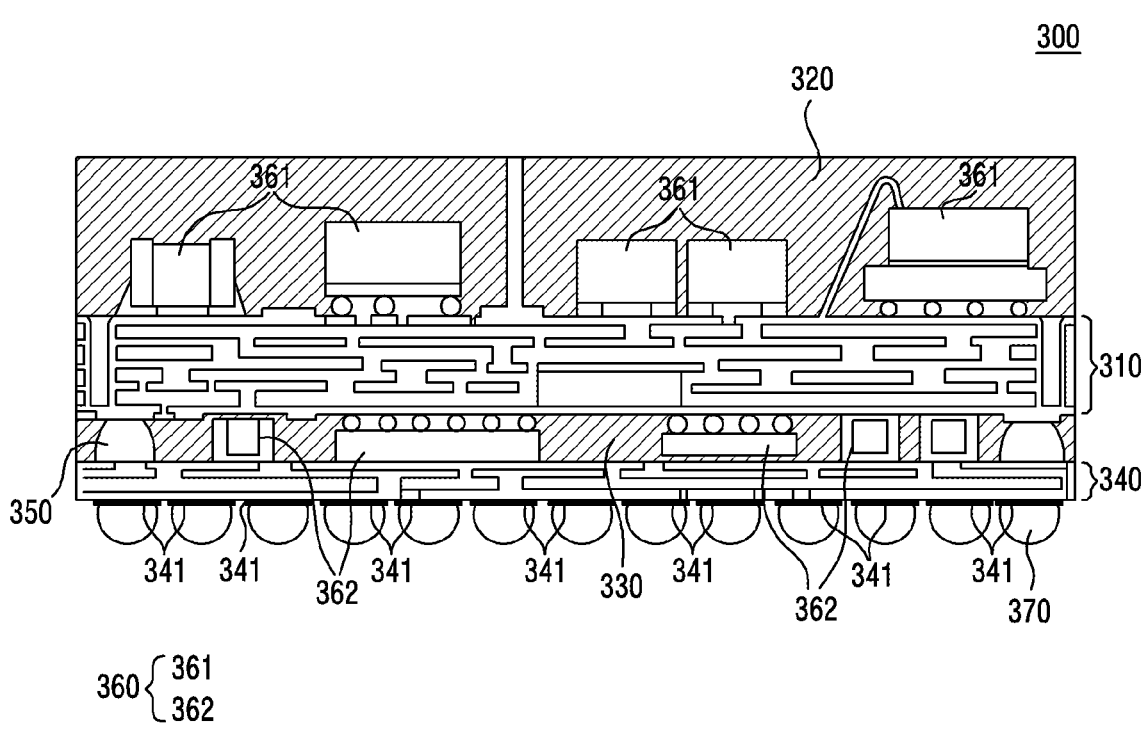
FIG. 3A is a cross-sectional view of an integrated circuit package according to various embodiments.
Figure 3B:
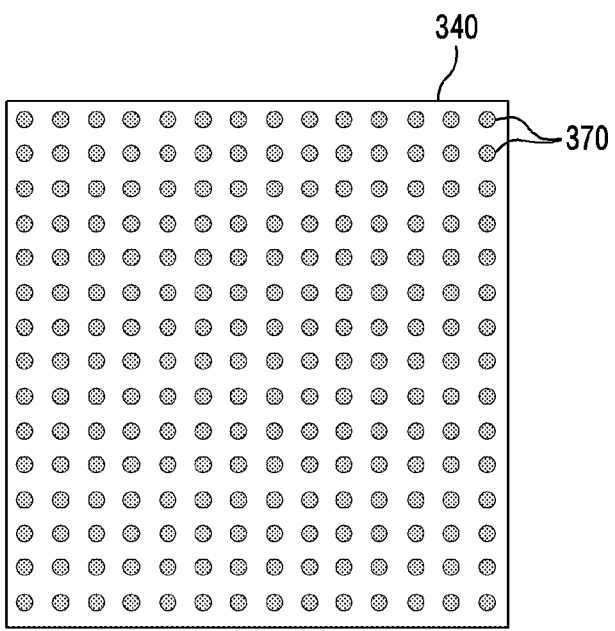
FIG. 3B is a diagram illustrating an example of a ball map of a lower surface of an integrated circuit package according to various embodiments.

FIG. 3A is a cross-sectional view of an example integrated circuit package according to various embodiments, and FIG. 3B is a diagram illustrating an example of a ball map of a lower surface of an integrated circuit package according to various embodiments.

Referring to FIG. 3A and FIG. 3B, an integrated circuit package 300 according to an embodiment of the disclosure may include a substrate 310, a first molding member 320, a second molding member 330, an interposer substrate 340, a connection member 350, a plurality of elements (or components) 360 including first elements 361 and second elements 362, and a soldering ball 370.

The substrate 310, the first molding member 320, the second molding member 330, the interposer substrate 340, the connection member 350, and the plurality of elements 360 may be identical (or similar) to the substrate 210, the first molding member 220, the second molding member 230, the interposer PCB 240, the connection member 250, and the plurality of elements 260, respectively. The detailed description thereof may not be repeated here.

According to various embodiments, the integrated circuit package 300 may provide the soldering ball 370 on the landing pad 341 via a ball process (e.g., a ball drop). Therefore, the integrated circuit package 300 may be provided in a BGA type. According to an embodiment, the landing pad 341 of the integrated circuit package 300 may have a shape suitable for ball formation, not necessarily the shape illustrated in FIG. 2B (e.g., a rectangle).

Figure 4:
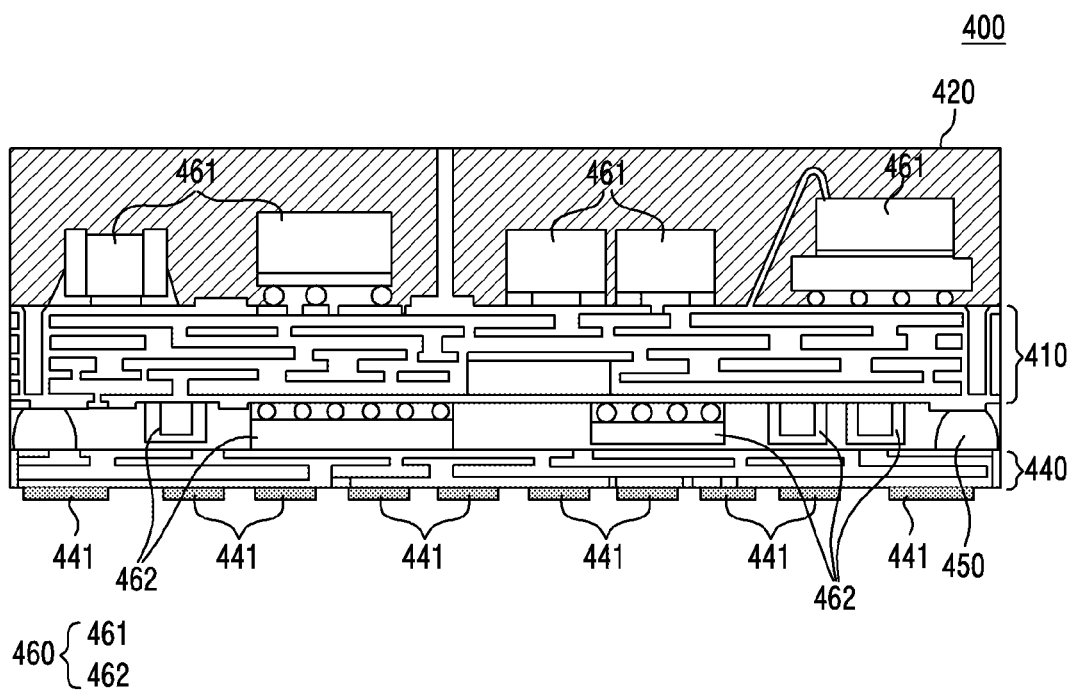
FIG. 4 is a cross-sectional view of an integrated circuit package according to various embodiments.

FIG. 4 is a cross-sectional view of an example integrated circuit package according to various embodiments.

Referring to FIG. 4, an integrated circuit package 400 according various embodiments may include a substrate 410, a first molding member 420, an interposer substrate 440, a connection member 450, and a plurality of elements (or components) 460 including first elements 461 and second elements 462.

The substrate 410, the first molding member 420, the interposer substrate 440, the connection member 450, and the plurality of elements (or components) 460 may be identical (or similar) to the substrate 210, the first molding member 220, the interposer PCB 240, the connection member 250, and the plurality of elements 260, respectively. The detailed description thereof may not be repeated here.

According to various embodiments, the integrated circuit package 400 does not mold a second surface of the substrate 410. This is because the second surface of the substrate 410 can be protected by the interposer substrate 440. Since the second surface is not molded, the manufacturing time and the manufacturing cost for the integrated circuit package 400 can be reduced and the manufacturing process therefor can be simplified.

According to an embodiment, the integrated circuit package 400 may further include a soldering ball (not illustrated) on a landing pad 441, similar to the integrated circuit package 300 in FIG. 3A.

Figure 5A:
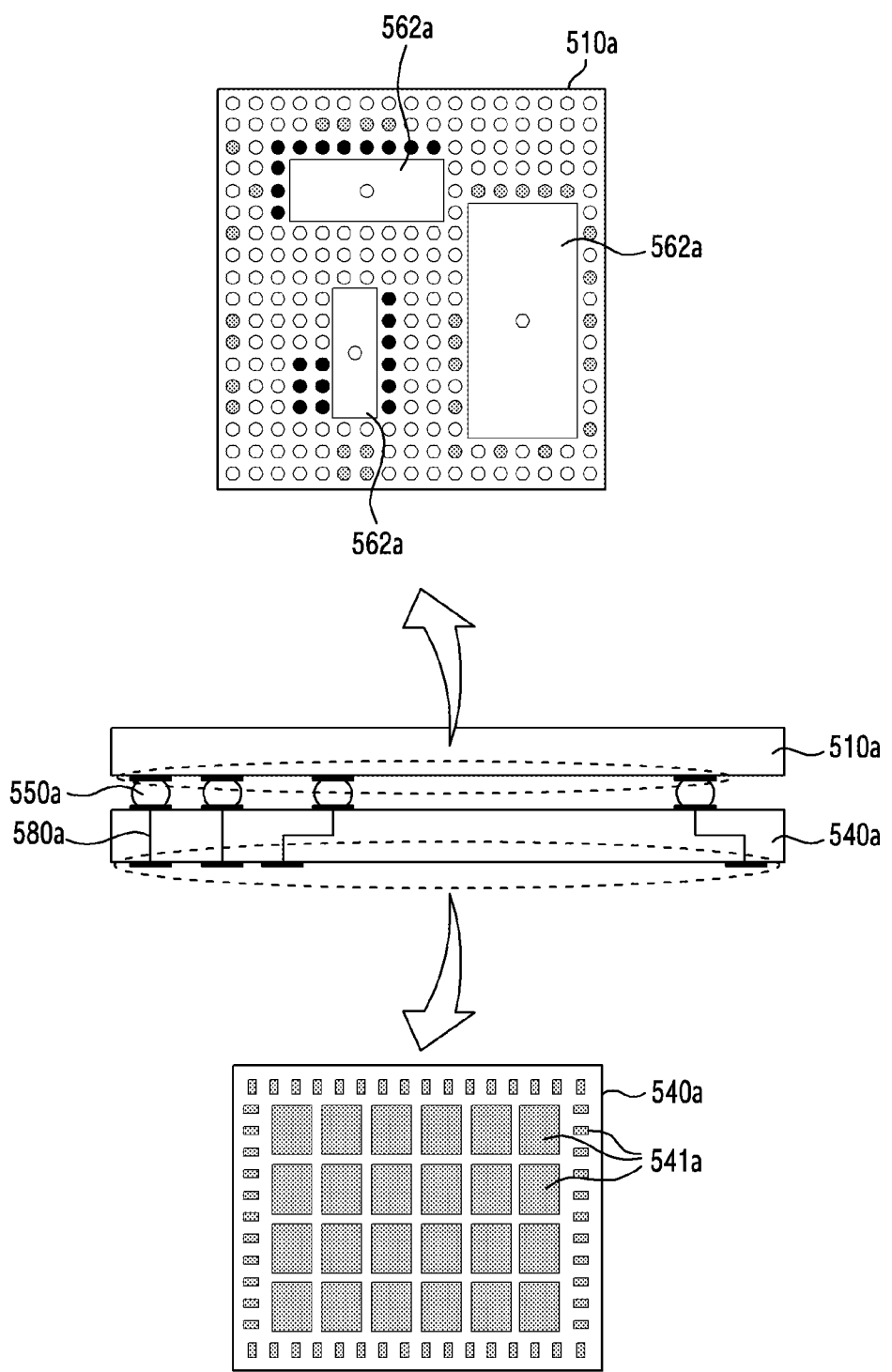
FIG. 5A is a diagram illustrating example shared use of a pin map of an integrated circuit package according to various embodiments.
Figure 5B:
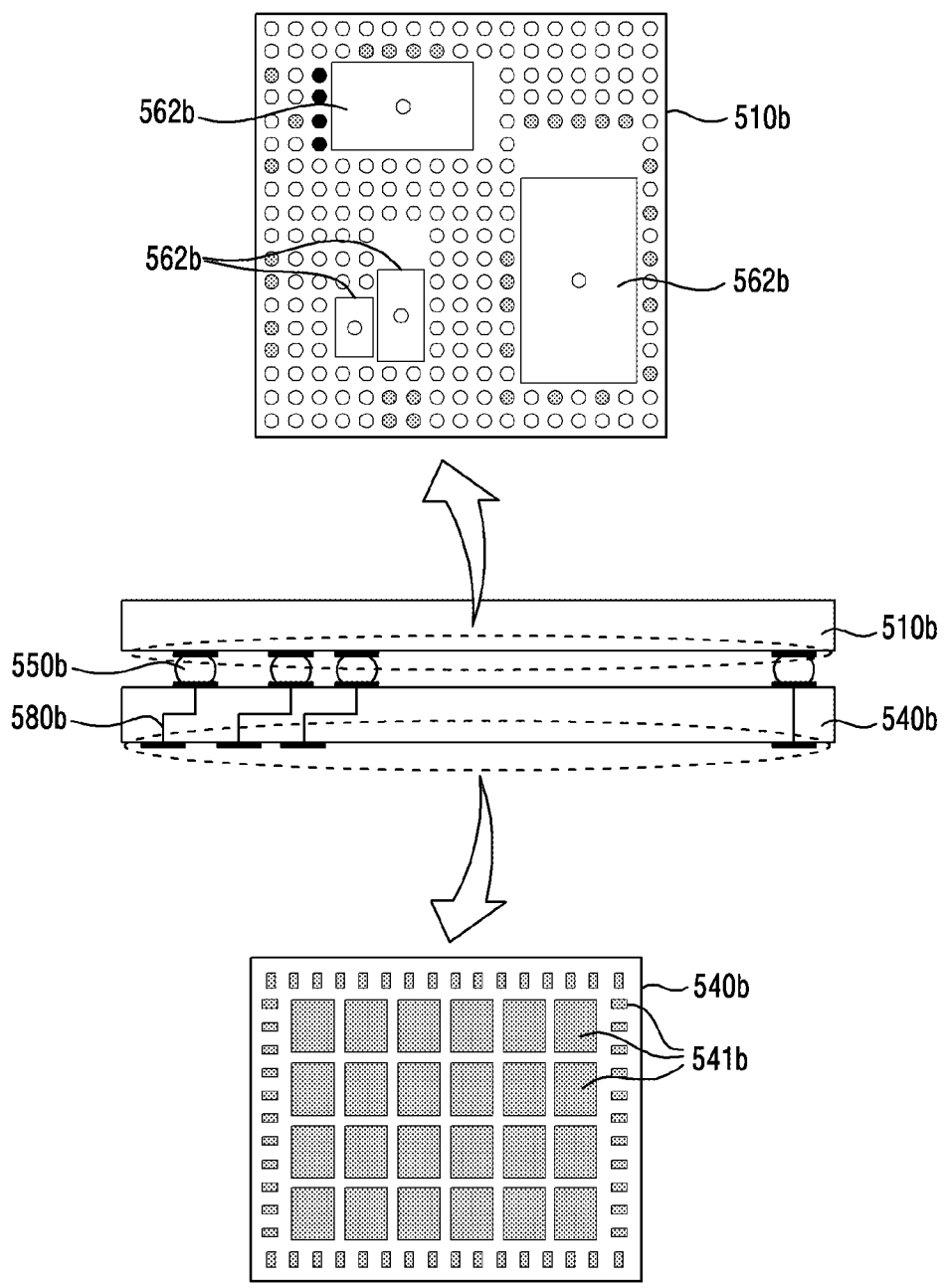
FIG. 5B is a diagram illustrating example shared use of a pin map of an integrated circuit package according to various embodiments.

FIG. 5A is a diagram illustrating example shared use of a pin map of an integrated circuit package according to various embodiments, and FIG. 5B is a diagram illustrating example shared use of a pin map of an integrated circuit package according to various embodiments.

Referring to FIG. 5A and FIG. 5B, an integrated circuit package (e.g., the integrated circuit package 200, 300, and 400) included in an electronic device according to various embodiments of the disclosure may be produced by a plurality of packaging companies. This is because a manufacturer of an electronic device may manufacture the electronic device using a plurality of integrated circuit packages produced by a plurality of packaging companies to smoothly supply the integrated circuit packages. The integrated circuit packages may have a plurality of elements which are positioned therein and arranged differently according to packaging companies. For example, as illustrated in FIG. 5A, a first substrate 510a of a first integrated circuit package produced by a first packaging company may have a plurality of second elements 562a with a first arrangement structure, and as illustrated in FIG. 5B, a second substrate 510b of a second integrated circuit package produced by a second packaging company may have a plurality of second elements 562b with a second arrangement structure different from the first arrangement structure.

According to various embodiments, an arrangement structure of landing pads 541a of the first integrated circuit package may be identical to an arrangement structure of landing pads 541b of the second integrated circuit package. In other words, the first integrated circuit package and the second integrated circuit package may have the same pin map (or a ball map). For example, as illustrated in FIG. 5A and FIG. 5B, pin maps of second surfaces of a first interposer substrate 540a of the first integrated circuit package and a second interposer substrate 540b of the second integrated circuit package may be identical.

According to various embodiments, the first integrated circuit package and the second integrated circuit package may have different electrical connection structures between a substrate and an interposer substrate. For example, as illustrated in FIG. 5A and FIG. 5B, an arrangement of a first connection member 550a and/or a first wire 580a of the first integrated circuit package may be different from an arrangement of a second connection member 550b and/or a second wire 580b of the second integrated circuit package.

As described above, in various embodiments of the disclosure, a plurality of integrated circuit packages produced by a plurality of packaging companies may use a pin map (or a ball map) in a shared manner using the interposer substrate. Accordingly, the manufacturer of the electronic device may not design and manufacture printed circuit boards (not illustrated) for electrical devices separately to correspond to each manufacturer's integrated circuit package. Therefore, the manufacturer of the electronic device can reduce the manufacturing cost and/or the manufacturing time of the electronic device.

Figure 6A:
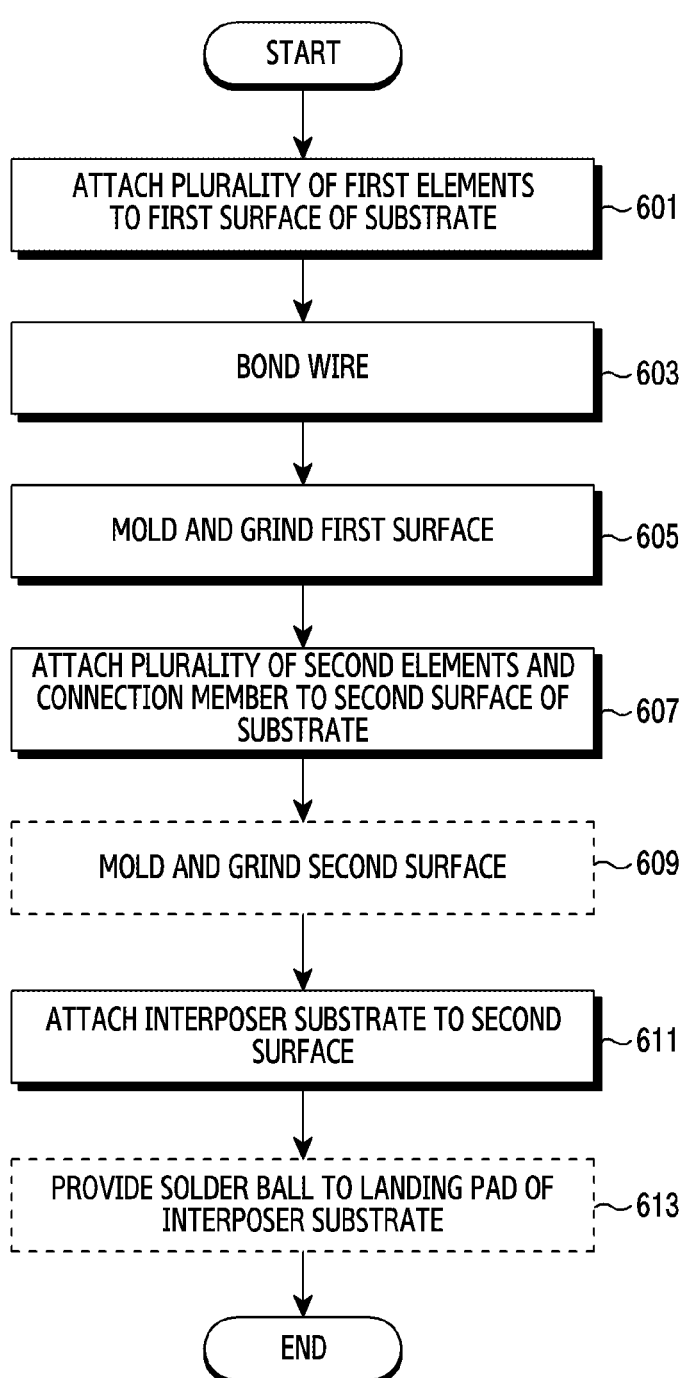
FIG. 6A is a flowchart illustrating an example packaging method of an integrated circuit package according to various embodiments.
Figure 6B:
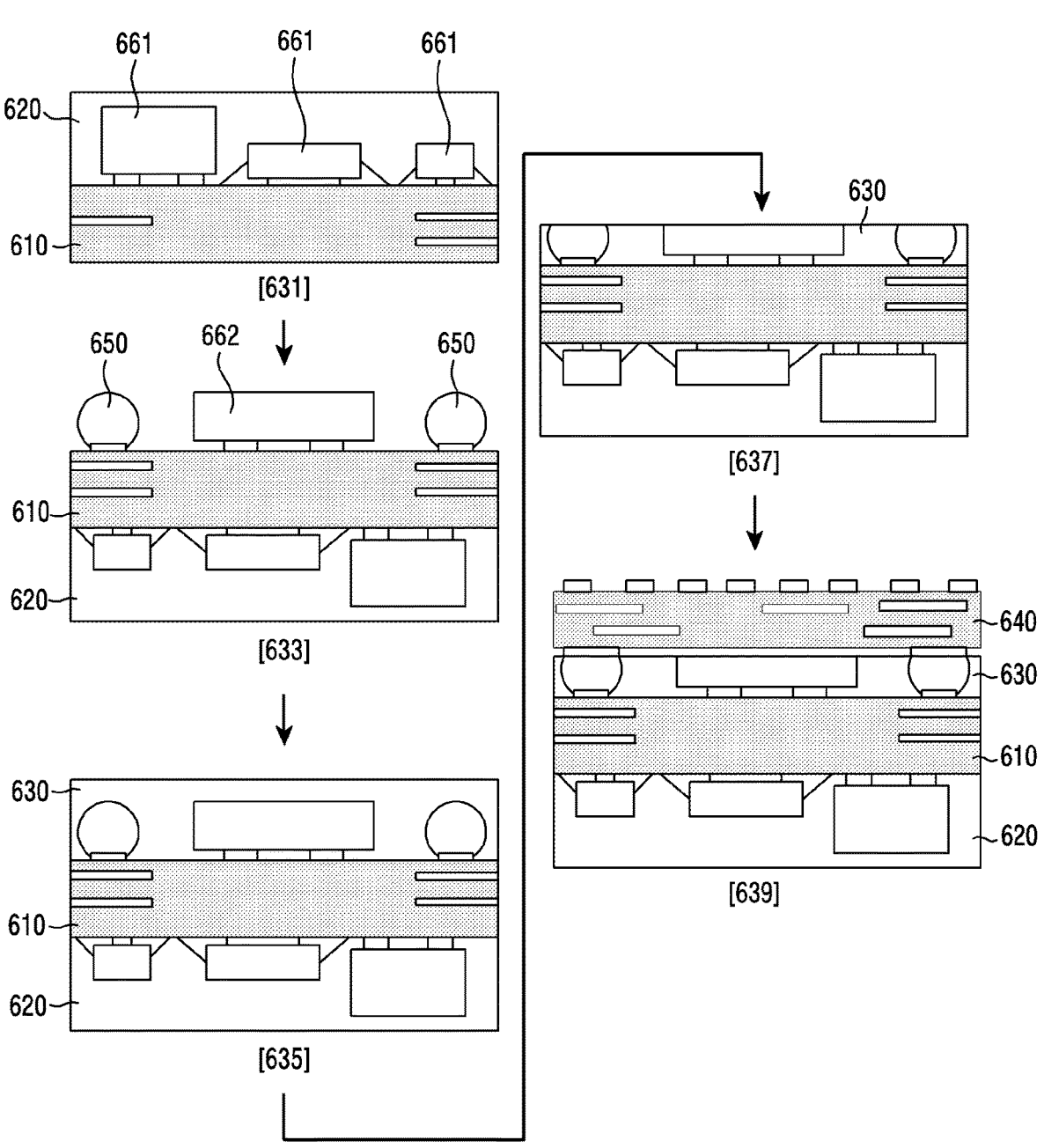
FIG. 6B is for a diagram illustrating an example packaging method of an integrated circuit package according to various embodiments.

FIG. 6A is a flowchart illustrating an example packaging method of an integrated circuit package according to various embodiments, and FIG. 6B is diagram illustrating an example packaging method of an integrated circuit package according to various embodiments.

Referring to FIG. 6A and FIG. 6B, according to a packaging method of an integrated circuit package (e.g., the integrated circuit package 200, 300, and 400) according to various embodiments of the disclosure, in operation 601, a plurality of elements may be attached to a first surface of a substrate (e.g., the substrate 210, 310, and 410, the first substrate 510a, and the second substrate 510b). For example, referring to FIG. 6B, a plurality of first elements 661 (e.g., the plurality of first elements 261) may be surface-mounted to a first surface of a substrate 610.

According to various embodiments, according to the method, in operation 603, a wire may be bonded. For example, an electrical connection process between first elements 661 and/or an electrical connection process between the first elements 661 and the substrate 610 may be performed using a conductive wire (e.g., a gold wire).

According to various embodiments, according to the method, in operation 605, the first surface may be molded and/or ground. For example, as illustrated in the drawing of reference numeral 631 of FIG. 6B, a packaging process for the first surface may be performed by mounting the plurality of first elements 661 to the first surface of the substrate 610, molding the first surface using a first molding member 620 (e.g., the first molding member 220, 320, and 420), and grinding the first molding member 620.

According to various embodiments, according to the method, in operation 607, a plurality of second elements 662 (e.g., the second elements 262, 562a, and 562b) and a connection member 650 (e.g., the connection member 250, 350, and 450, the first connection member 550a, and the second connection member 550b) may be attached to a second surface of the substrate. For example, as illustrated in the drawing of reference numeral 633 of FIG. 6B, the plurality of second elements 662 and the connection member 650 may be surface mounted to a second surface of the substrate 610.

According to various embodiments, according to the method, in operation 609, the second surface may be molded or ground. For example, as illustrated in the drawings of reference numerals 635 and 637 of FIG. 6B, the second surface of the substrate 610 may be molded using a second molding member 630 (e.g., the second molding member 230 and 330), and a part of the second molding member 630 may be ground to allow the surface of the second element 652 and the connection member 650 to be exposed to the outside. According to an embodiment, operation 609 may be omitted. For example, operation 609 may be omitted in a case of producing the integrated circuit package of FIG. 4.

According to various embodiments, according to the method, in operation 611, an interposer substrate 640 (e.g., the interposer substrate 240, 340, and 440, the first interposer substrate 540a, and the second interposer substrate 540b) may be attached to the second surface. For example, as illustrated in the drawing of reference numeral 639 of FIG. 6B, the interposer substrate 640 may be surface-mounted to the second surface of the substrate 610.

According to various embodiments, according to the method, in operation 613, a soldering ball may be provided at a landing pad (e.g., the landing pad 241, 341, 441, 541a, and 541b) of the interposer substrate. According to an embodiment, operation 613 may be omitted. For example, the method may perform operation 613 in a case of producing a BGA type integrated circuit package such as the integrated circuit package in FIG. 3A and FIG. 3B.

According to various example embodiments, an electronic device (e.g., the electronic device 101) may include: a printed circuit board; and an integrated circuit package (e.g., the integrated circuit package 200, 300, and 400) attached to the printed circuit board. The integrated circuit package may include: a substrate (e.g., the substrate 210, 310, 410, and 610, the first substrate 510a, and the second substrate 510b) on which a plurality of elements are attached to a first surface and a second surface opposite to the first surface; a first mold (e.g., the first molding member 220, 320, 420, and 620) covering the first surface of the substrate; an interposer substrate (e.g., the interposer substrate 240, 340, 440, and 640, the first interposer substrate 540a, and the second interposer substrate 540b) attached to the second surface of the substrate and including landing pads (e.g., the landing pads 241, 341, 441, 541a, and 541b) for an electrical connection with the printed circuit board; and a connection member (e.g., the connection member 250, 350, 450, and 650, the first connection member 550a, and the second connection member 550b) comprising a conductive material configured to electrically connect the substrate and the interposer substrate.

According to various example embodiments, the connection member may include an interposer ball.

According to various example embodiments, the substrate may include: a first substrate (e.g., the first substrate 510a) on which the plurality of elements have a first arrangement structure; and a second substrate (e.g., the second substrate 510b) on which the plurality of elements have a second arrangement structure different from the first arrangement structure.

According to various example embodiments, the interposer substrate may include: a first interposer substrate (e.g., the first interposer substrate 540a) corresponding to the first substrate; and a second interposer substrate (e.g., the second interposer substrate 540b) corresponding to the second substrate.

According to various example embodiments, the first interposer substrate and the second interposer substrate may include a same arrangement of landing pads, and an electrical connection structure between the first substrate and the first interposer substrate may be different from an electrical connection structure between the second substrate and the second interposer substrate.

According to various example embodiments, the integrated circuit package may be positioned between the second surface of the substrate and the interposer substrate and may further include a second mold (e.g., the second molding member 230, 330, and 630) covering the second surface.

According to various example embodiments, the integrated circuit package may further include a soldering ball (e.g., the soldering ball 370) provided on the landing pad.

According to various example embodiments, an integrated circuit package (e.g., the integrated circuit package 200, 300, and 400) may include: a substrate (e.g., the substrate 210, 310, 410, and 610, the first substrate 510a, and the second substrate 510b) on which a plurality of elements are attached to a first surface and a second surface opposite to the first surface; a first mold (e.g., the first molding member 220, 320, 420, and 620) covering the first surface of the substrate; an interposer substrate (e.g., the interposer substrate 240, 340, 440, and 640, the first interposer substrate 540a, and the second interposer substrate 540b) attached to the second surface of the substrate and including landing pads (e.g., the landing pads 241, 341, 441, 541a, and 541b) for an electrical connection with the printed circuit board; and a connection member (e.g., the connection member 250, 350, 450, and 650, the first connection member 550a, and the second connection member 550b) comprising a conductive material configured to electrically connect the substrate and the interposer substrate.

According to various example embodiments, the connection member may include an interposer ball.

According to various example embodiments, the substrate may include: a first substrate (e.g., the first substrate 510a) on which the plurality of elements have a first arrangement structure; and a second substrate (e.g., the second substrate 510b) on which the plurality of elements have a second arrangement structure different from the first arrangement structure.

According to various example embodiments, the interposer substrate may include: a first interposer substrate (e.g., the first interposer substrate 540a) corresponding to the first substrate; and a second interposer substrate (e.g., the second interposer substrate 540b) corresponding to the second substrate.

According to various example embodiments, the first interposer substrate and the second interposer substrate may include a same arrangement of landing pads, and an electrical connection structure between the first substrate and the first interposer substrate may be different from an electrical connection structure between the second substrate and the second interposer substrate.

According to various example embodiments, the integrated circuit package may be positioned between the second surface of the substrate and the interposer substrate and may further include a second mold (e.g., the second molding member 230, 330, and 630) covering the second surface.

According to various example embodiments, the integrated circuit package may further include a soldering ball (e.g., the soldering ball 370) provided on the landing pad.

According to various example embodiments \, a method for manufacturing an integrated circuit package may include: attaching at least one first element (e.g., the first element 261, 361, 461, and 661) to a first surface of a substrate (e.g., the substrate 210, 310, 410, and 610, a first substrate 510a, and a second substrate 510b); molding the first surface using a first mold (e.g., the first molding member 220, 320, 420, and 620); grinding the first mold; attaching at least one second element (e.g., the second element 262, 362, 462, and 662) and at least one connection member (e.g., the connection member 250, 350, 450, and 650, the first connection member 550a, and the second connection member 550b) comprising a conductive material to a second surface of the substrate; and attaching an interposer substrate (e.g., the interposer substrate 240, 340, 440, and 640, the first interposer substrate 540a, and the second interposer substrate 540b) including landing pads (e.g., the landing pads 241, 341, 441, 541a, and 541b) for an electrical connection with a printed circuit board included in an electronic device (e.g., the electronic device 101) to the second surface of the substrate.

According to various example embodiments, the method may include: molding the second surface using a second mold (e.g., the second molding member 230, 330, and 630); and grinding the first mold.

According to various example embodiments, the method may include: providing a soldering ball (e.g., the soldering ball 370) on the landing pads of the interposer substrate.

According to various example embodiments, the connection member may include an interposer ball.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
a printed circuit board; and
an integrated circuit package attached to the printed circuit board,
wherein the integrated circuit package includes:
a substrate on which a plurality of elements are attached to a first surface and a second surface opposite to the first surface;
a first mold covering the first surface of the substrate;
an interposer substrate attached to the second surface of the substrate and including landing pads for an electrical connection with the printed circuit board; and
a connection member comprising a conductive material configured to electrically connect the substrate and the interposer substrate,
wherein the substrate includes:
a first substrate on which the plurality of elements comprise a first arrangement structure; and
a second substrate on which the plurality of elements comprise a second arrangement structure different from the first arrangement structure.

2. The electronic device of claim 1, wherein the connection member includes an interposer ball.

3. The electronic device of claim 1,
wherein the interposer substrate includes:
a first interposer substrate corresponding to the first substrate; and
a second interposer substrate corresponding to the second substrate.

4. The electronic device of claim 3,
wherein the first interposer substrate and the second interposer substrate include a same arrangement of landing pads, and
wherein an electrical connection structure between the first substrate and the first interposer substrate is different from an electrical connection structure between the second substrate and the second interposer substrate.

5. The electronic device of claim 1,
the integrated circuit package further includes a second mold positioned between the second surface of the substrate and the interposer substrate and covering the second surface.

6. The electronic device of claim 5, wherein the integrated circuit package further includes a soldering ball provided on the landing pad.

7. The electronic device of claim 1, wherein the integrated circuit package further includes a soldering ball provided on the landing pad.

8. An integrated circuit package comprising:
a substrate on which a plurality of elements are attached to a first surface and a second surface opposite to the first surface;
a first mold covering the first surface of the substrate;
an interposer substrate attached to the second surface of the substrate and including landing pads for an electrical connection with a printed circuit board included in an electronic device; and
a connection member comprising a conductive material configured to electrically connect the substrate and the interposer substrate,
wherein the substrate includes:

a first substrate on which the plurality of elements have a first arrangement structure; and a second substrate on which the plurality of elements have a second arrangement structure different from the first arrangement structure.

9. The integrated circuit package of claim 8, wherein the connection member includes an interposer ball.

10. The integrated circuit package of claim 8, wherein the interposer substrate includes:

a first interposer substrate corresponding to the first substrate; and a second interposer substrate corresponding to the second substrate.

11. The integrated circuit package of claim 10, wherein the first interposer substrate and the second interposer substrate include a same arrangement of landing pads, and wherein an electrical connection structure between the first substrate and the first interposer substrate is different from an electrical connection structure between the second substrate and the second interposer substrate.

12. The integrated circuit package of claim 8, further comprising a second mold positioned between the second surface of the substrate and the interposer substrate and covering the second surface.

13. The integrated circuit package of claim 12, further comprising a soldering ball provided on the landing pad.

14. The integrated circuit package of claim 8, further comprising a soldering ball provided on the landing pad.

* * * * *